(12) United States Patent
Gao

(10) Patent No.: US 9,780,153 B2
(45) Date of Patent: Oct. 3, 2017

(54) ORGANIC LIGHT EMITTING DIODE ARRAY SUBSTRATE, ORGANIC LIGHT EMITTING DIODE DISPLAY DEVICE HAVING THE SAME, AND MANUFACTURING METHOD THEREOF

(71) Applicant: BOE TECHNOLOGY GROUP CO., LTD., Beijing (CN)

(72) Inventor: Jing Gao, Beijing (CN)

(73) Assignee: BOE TECHNOLOGY GROUP CO., LTD., Chaoyang District, Beijing (CN)

( * ) Notice: Subject to any disclaimer, the term of this patent is extended or adjusted under 35 U.S.C. 154(b) by 0 days.

(21) Appl. No.: 15/035,754

(22) PCT Filed: Dec. 10, 2015

(86) PCT No.: PCT/CN2015/096902
§ 371 (c)(1),
(2) Date: May 11, 2016

(87) PCT Pub. No.: WO2016/176992
PCT Pub. Date: Nov. 10, 2016

(65) Prior Publication Data
US 2017/0104043 A1    Apr. 13, 2017

(30) Foreign Application Priority Data

May 6, 2015 (CN) .......................... 2015 1 0227877

(51) Int. Cl.
*H01L 29/08* (2006.01)
*H01L 21/00* (2006.01)
(Continued)

(52) U.S. Cl.
CPC ...... *H01L 27/3246* (2013.01); *H01L 27/3258* (2013.01); *H01L 27/3276* (2013.01);
(Continued)

(58) Field of Classification Search
CPC ............ H01L 27/3246; H01L 51/5218; H01L 51/5228; H01L 27/3276; H01L 51/56;
(Continued)

(56) References Cited

U.S. PATENT DOCUMENTS 7,834,543 B2 * 11/2010 Takata ................ H01L 27/3246
313/498
8,659,011 B2 * 2/2014 Yokoyama .......... H01L 51/5212
257/40

(Continued)

FOREIGN PATENT DOCUMENTS

CN      101340754 A    1/2009
CN         1855484 B   10/2010
(Continued)

OTHER PUBLICATIONS

International Search Report & Written Opinion dated Mar. 28, 2016 regarding PCT/CN2015/096902.
(Continued)

*Primary Examiner* — Thinh T Nguyen
(74) *Attorney, Agent, or Firm* — Intellectual valley law, P.C.

(57) ABSTRACT

The present application discloses an organic light emitting diode array substrate comprising a base substrate; a first electrode; a second electrode; and a pixel definition layer. The pixel definition layer comprises a first insulating layer comprising a plurality of first insulating units; a second insulating layer comprising a plurality of second insulating units; and a conductive layer comprising a plurality of interconnected conductive units sandwiched by the first insulating layer and the second insulating layer.

20 Claims, 2 Drawing Sheets

(51) Int. Cl.
  *H01L 27/32* (2006.01)
  *H01L 51/52* (2006.01)
  *H01L 51/56* (2006.01)

(52) U.S. Cl.
  CPC ...... *H01L 51/5218* (2013.01); *H01L 51/5228* (2013.01); *H01L 51/56* (2013.01); *H01L 2224/48091* (2013.01); *H01L 2224/48247* (2013.01); *H01L 2227/323* (2013.01)

(58) Field of Classification Search
  CPC ........... H01L 27/3258; H01L 2227/323; H01L 2251/5315
  USPC ...... 257/40, 59, 72, 642, E39.007, E51.001; 438/82, 99
  See application file for complete search history.

(56) References Cited

U.S. PATENT DOCUMENTS

| | | | |
|---|---|---|---|
| 2004/0251827 A1 | 12/2004 | Kang | |
| 2006/0017375 A1 | 1/2006 | Noguchi et al. | |
| 2008/0024476 A1* | 1/2008 | Choi | G02F 1/1362 345/207 |
| 2008/0138653 A1* | 6/2008 | Lee | C03C 8/24 428/690 |
| 2009/0009069 A1* | 1/2009 | Takata | H01L 27/3246 313/504 |
| 2014/0062292 A1* | 3/2014 | Seong | H01L 51/5253 313/504 |

FOREIGN PATENT DOCUMENTS

| | | |
|---|---|---|
| CN | 103296052 A | 9/2013 |
| CN | 103700675 A | 4/2014 |
| CN | 104867962 A | 8/2015 |

OTHER PUBLICATIONS

The First Office Action in the Chinese Patent Application No. 201510227877.9, dated May 10, 2017; English translation attached.

* cited by examiner

ORGANIC LIGHT EMITTING DIODE ARRAY SUBSTRATE, ORGANIC LIGHT EMITTING DIODE DISPLAY DEVICE HAVING THE SAME, AND MANUFACTURING METHOD THEREOF

CROSS-REFERENCE TO RELATED APPLICATION

This application is a national stage application under 35 U.S.C. §371 of International Application No. PCT/CN2015/096902 filed Dec. 10, 2015, which claims priority to Chinese Patent Application No. 201510227877.9, filed May 6, 2015, the contents of which are incorporated by reference in the entirety.

FIELD

The present invention relates to display technology, more particularly, to an organic light emitting diode array substrate, an organic light emitting diode display device having the same, and a manufacturing method thereof.

BACKGROUND

As compared to other display devices, the organic light emitting diode (OLED) display devices are thinner and lighter, and having lower power consumption and lower cost. Typically, the OLED display device also has higher brightness, wider viewing angle, higher contrast, and higher flexibility.

An OLED display device includes an array substrate having an OLED disposed thereon. The first electrode (typically the cathode) is typically a plate electrode covering the array substrate. Usually, the first electrode is made of conductive metals such as magnesium or silver. Because light emits from the first electrode in a top emitting OLED, it requires a first electrode having a high transmission rate. Thus, the first electrode is often manufactured as a very thin layer having high resistance. Consequently, the IR drop of the first electrode is relatively large, resulting in a non-uniform image display.

SUMMARY

In one aspect, the present invention provides an organic light emitting diode array substrate comprising a base substrate; a first electrode; a second electrode; and a pixel definition layer. The pixel definition layer comprises a first insulating layer comprising a plurality of first insulating units; a second insulating layer comprising a plurality of second insulating units; and a conductive layer comprising a plurality of interconnected conductive units sandwiched by the first insulating layer and the second insulating layer.

Optionally, the conductive layer is covered by the first insulating layer and the second insulating layer within a display region.

Optionally, the conductive layer is connected to the first electrode outside the display region.

Optionally, the conductive layer is insulated from the second electrode by the first insulating layer.

Optionally, the second electrode, the first insulating layer, the conductive layer, the second insulating layer, and the first electrode are sequentially on the base substrate.

Optionally, the organic light emitting diode array substrate further comprises a thin film transistor; and an organic light emitting layer.

Optionally, the thin film transistor, the second electrode, the first insulating layer, the conductive layer, the second insulating layer, the organic light emitting layer, and the first electrode are sequentially on the base substrate.

Optionally, the conductive layer is insulated from the organic light emitting layer by the second insulating layer.

Optionally, the conductive layer comprises a portion outside the display region not covered by the second insulating layer, the portion is connected to the first electrode.

Optionally, the second insulating layer covers the conductive layer outside the display region, the first electrode is connected to the conductive layer through a via in the second insulating layer outside the display region.

Optionally, the second insulating layer is made of a second insulating material comprising an inorganic insulating material; and the conductive layer is made of a conductive material comprising one or more of indium tin oxide, molybdenum, aluminum, and neodymium.

Optionally, the first insulating layer is made of a first insulating material comprising an organic insulating material.

Optionally, the first insulating layer is made of a first insulating material comprising an inorganic insulating material.

In another aspect, the present invention also provides a method of manufacturing an organic light emitting diode array substrate, comprising forming a second electrode on a base substrate; forming a pixel definition layer; and forming a first electrode.

Optionally, the step of forming the pixel definition layer comprises forming a first insulating layer comprising a plurality of first insulating units; forming a second insulating layer comprising a plurality of second insulating units; and forming a conductive layer comprising a plurality of interconnected conductive units sandwiched by the first insulating layer and the second insulating layer.

Optionally, the method further comprises connecting the conductive layer to the first electrode outside the display region.

Optionally, the conductive layer is covered by the first insulating layer and the second insulating layer within a display region.

Optionally, the conductive layer is insulated from the second electrode by the first insulating layer.

Optionally, the second electrode, the first insulating layer, the conductive layer, the second insulating layer, and the first electrode are sequentially on the base substrate.

Optionally, the method further comprises forming a thin film transistor on the base substrate prior to forming the first insulating layer; and forming an organic light emitting layer prior to forming the first electrode and after forming a second insulating layer.

Optionally, the conductive layer is insulated from the organic light emitting layer by the second insulating layer.

Optionally, the second insulating layer covers the conductive layer outside the display region, the method further comprises forming a via in the second insulating layer, the via connects the conductive layer and the first electrode outside the display region.

Optionally, after forming the second insulating layer, the step of forming the organic light emitting layer comprises masking the via using a mask; and evaporation coating the base substrate with an organic light emitting material.

In another aspect, the present invention further provides an organic light emitting diode display device comprising an organic light emitting diode array substrate described herein or manufactured by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In conventional OLED display devices, a first electrode auxiliary line (e.g., a cathode auxiliary line) is disposed outside the display area of the array substrate in order to reduce IR drop of the first electrode (e.g., the cathode). IR drop refers to voltage drop due to the resistance of a component in an organic light emitting display panel. Typically, the first electrode auxiliary line is in a same layer as the anode. The gate line, the data line, and the power supply line are in a same layer as the thin film transistor. In a conventional OLED display device, the first electrode auxiliary line does not overlap with gate line, the data line or the power supply line in plan view of the substrate. Rather, the first electrode auxiliary line occupies additional space in a non-display area in plan view of the substrate. Thus, the conventional design results in a reduction of aperture ratio of the OLED display panel. The present disclosure provides an organic light emitting diode array substrate having a reduced IR drop without sacrificing aperture ratio of the OLED display panel.

Figure 1:
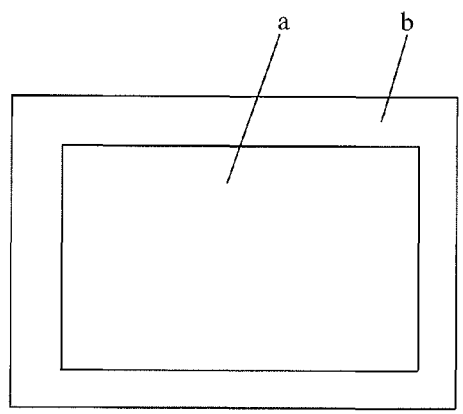
FIG. 1 is a diagram illustrating the structure of an OLED array substrate in plan view in an embodiment.
Figure 2:
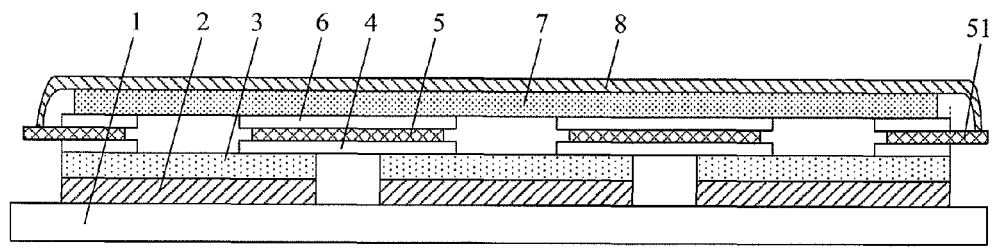
FIG. 2 is a cross-sectional view of an OLED array substrate in an embodiment.

FIG. 1 is a diagram illustrating the structure of an OLED array substrate in plan view in an embodiment. FIG. 2 is a cross-sectional view of an OLED array substrate in an embodiment. Referring to FIGS. 1 and 2, the organic light emitting diode array substrate in the embodiment includes a pixel definition layer having a three-layer sandwiched structure. Specifically, the pixel definition layer includes a first insulating layer 4 having a plurality of first insulating units, a second insulating layer 6 having a plurality of second insulating units, and a conductive layer 5 having a plurality of interconnected conductive units sandwiched by the first insulating layer 4 and the second insulating layer 6. The organic light emitting diode array substrate in the embodiment also includes a first electrode 8 and a second electrode 3. Optionally, the first electrode 8 is a cathode. Optionally, the second electrode 3 is an anode.

In some embodiments, the conductive layer 5 is covered by the first insulating layer 4 and the second insulating layer 6 within a display region. For example, within the display region a, the projection of the first insulating layer 4 covers the projection of the conductive layer 5 in plan view of the array substrate, and the projection of the second insulating layer 6 covers the projection of the conductive layer 5 in plan view of the array substrate. Optionally, each first insulating unit and each second insulating unit cover each conductive unit within the display region a. As a result, the conductive layer 5 does not occupy any additional aperture region of the array substrate. By having the conductive layer 5 covered by the first insulating layer 4 and the second insulating layer 6, the aperture ratio of the array substrate is not affected.

In some embodiments, the conductive layer 5 is connected to the first electrode 8 outside the display region a (i.e., within a non-display region b) of the array substrate. Optionally, the first electrode 8 is connected to at least one of the conductive units. As a result, the IR drop of the first electrode 8 can be significantly reduced, resulting in a more uniform image display.

In some embodiments, the first electrode 8 is connected to the conductive layer 5 within a display region a.

In some embodiments, the second electrode 3, the first insulating layer 4, the conductive layer 5, the second insulating layer 6, and the first electrode 8 are sequentially on the base substrate 1. The conductive layer 5 is insulated from the second electrode 3 by the first insulating layer 4.

Based on the above, the pixel definition layer in the embodiment has a sandwiched structure containing a first insulating layer 4, a conductive layer 5, and a second insulating layer 6. The first insulating layer 4 and the second insulating layer 6 isolate and insulate the conductive layer 5 from other conductive structures such as electrodes and organic light emitting layers in the array substrate, obviating the need for an additional insulating layer and simplifying the manufacturing process. Optionally, the plurality of first insulating units in the first insulating layer 4 may be in a same layer, and may be interconnected to form a grid structure. Optionally, the plurality of second insulating units in the second insulating layer 6 may be in a same layer, and may be interconnected to form a grid structure. Similarly, the plurality of the conductive units may be disposed in a same layer, and may be interconnected to form a conductive grid structure. Optionally, the grid structure of the first insulting layer 4 cover the grid structure of the conductive layer 5. Optionally, the grid structure of the second insulating layer 6 covers the grid structure of the conductive layer 5. Optionally, the plurality of first insulating units in the first insulating layer 4 is in a same layer and interconnected to form a grid structure, the plurality of second insulating units in the second insulating layer 6 is disposed in a same layer and interconnected to form a grid structure, and the plurality of the conductive units is in a same layer and interconnected to form a conductive grid structure. Optionally, the grid structure of the conductive layer 5 is covered by the grid structure of the first insulating layer 4 and the second insulating layer 6.

In some embodiments, the array substrate further includes a thin film transistor 2 and an organic light emitting layer 7. Optionally, the thin film transistor 2, the second electrode 3, the first insulating layer 4, the conductive layer 5, the second insulating layer 6, the organic light emitting layer 7, and the first electrode 8 are sequentially disposed on the base substrate 1. Optionally, the second electrode 3 is a multi-layer high-reflective electrode comprising indium tin oxide and silver for enhancing light utilization. Optionally, the first electrode 8 is made of magnesium or silver. Optionally, the first electrode 8 is a cathode and the second electrode 3 is an anode. Optionally, the first electrode 8 is an anode and the second electrode 3 is a cathode.

Image display is affected when the conductive layer 5 and the second electrode 3 are connected. Therefore, the conductive layer 5 is insulated from the second electrode 3. For example, to avoid any connection between the conductive layer 5 and the second electrode 3, within the display region a, the conductive layer 5 is covered by the first insulating layer 4. That is, the projection of the first insulating layer 4 covers the projection of the conductive layer 5 in plan view of the array substrate.

Similarly, image display is affected when the conductive layer 5 and the organic light emitting layer 7 is connected. Therefore, the conductive layer 5 is insulated from the organic light emitting layer 7. For example, to avoid any connection between the conductive layer 5 and the organic light emitting layer 7, the conductive layer 5 is covered by the second insulating layer 6 within the display region a. That is, the projection of the second insulating layer 6 covers the projection of the conductive layer 5 in plan view of the array substrate.

In conventional OLED display devices, a first electrode auxiliary line (e.g., a cathode auxiliary line) is used to reduce the IR drop of the first electrode. In a subsequent step of forming the organic light emitting layer, a fine metal mask (FMM) is required for evaporation coating of the organic light emitting material. The use of FMM makes the manufacturing process significantly more complicated, resulting in material waste and lower manufacturing efficiency.

The array substrate in some embodiments uses a conductive layer 5 covered by the second insulating layer 6 within the display region a, i.e., the projection of the second insulating layer 6 covers the projection of the conductive layer 5 within the display region a in plan view of the array substrate. In a subsequent step of forming the organic light emitting layer 7, a fine metal mask (FMM) is not required. For example, an open mask procedure may be used for evaporation coating of the organic light emitting material to form the organic light emitting layer 7, avoiding various complications associated with the FMM. This significantly simplifies the manufacturing process, enhances the manufacturing efficiency, and saves material.

In some embodiments, the conductive layer 5 is connected to the first electrode 8 in the display region a of the array substrate.

In some embodiments, the conductive layer 5 is connected to the first electrode 8 outside of the display region a. Optionally, the conductive layer has a portion 51 which is not covered by the second insulating layer 6 outside the display region a. Optionally, the conductive layer 5 is connected to the first electrode 8 through the portion 51 (FIG. 2).

Figure 3:
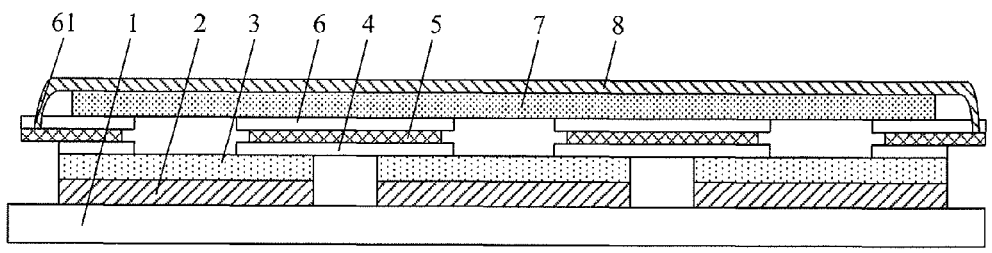
FIG. 3 is a cross-sectional view of an OLED array substrate in another embodiment.

In some embodiments, the second insulating layer 6 covers the conductive layer 5 outside the display region a. Optionally, the first electrode 8 is connected to the conductive layer 5 through a via 61 in the second insulating layer 6 outside the display region a (FIG. 3).

The first insulating layer 4 can be made of any suitable material, e.g., a first insulating material having an organic insulating material or an inorganic insulating material. Similarly, the second insulating layer 6 can be made of any suitable material, e.g., a second insulating material having an organic insulating material or an inorganic insulating material. Examples of organic insulating materials include, but are not limited to, a photoresist material (e.g., a positive photoresist material), an acrylic resin, and a polyimide resin. Examples of inorganic insulating materials include, but are not limited to, silicon nitride ($SiN_x$), silicon oxide ($SiO_x$), and silicon oxide nitride ($SiO_xN_y$).

Optionally, the first insulating layer 4 and/or the second insulating layer 6 is made of an inorganic insulating material. A sandwiched structure having a conductive layer 5 and an inorganic first and/or second insulating layers is exceptionally moisture/oxygen resistant. Optionally, both the first insulating layer 4 and the second insulating layer 6 are made of inorganic insulating materials. Optionally, the second insulating layer 6 is made of an inorganic insulating material, and the first insulating layer 4 is made of an organic insulating material.

The conductive layer 5 may be made of any suitable conductive material. Optionally, the conductive layer 5 is made of one or more of indium tin oxide, molybdenum, aluminum, and neodymium.

The present disclosure also provides a method of manufacturing an organic light emitting diode array substrate. In some embodiments, the method includes forming a pixel definition layer. The pixel definition layer includes a first insulating layer 4 having a plurality of first insulating units, a second insulating layer 6 having a plurality of second insulating units, and a conductive layer 5 having a plurality of interconnected conductive units sandwiched by the first insulating layer 4 and the second insulating layer 6. The conductive layer 5 is covered by the first insulating layer 4 and the second insulating layer 6 within the display region. Thus, the step of forming a pixel definition layer optionally includes forming a first insulating layer 4 having a plurality of first insulating units, forming a second insulating layer 6 having a plurality of second insulating units, and forming a conductive layer 5 having a plurality of interconnected conductive units sandwiched by the first insulating layer 4 and the second insulating layer 6.

In some embodiments, the method includes forming a first electrode 8. Optionally, the method further includes connecting the conductive layer 5 to the first electrode 8 outside the display region.

In some embodiments, the method further includes forming a second electrode 3 on a base substrate 1. Optionally, the second electrode 3, the first insulating layer 4, the conductive layer 5, the second insulating layer 6, and the first electrode 8 are sequentially on the base substrate 1. Optionally, the conductive layer 5 is insulated from the second electrode 3, e.g., by the first insulating layer 4.

For example, within a display region a, the conductive layer 5 is covered by the first insulating layer 4. That is, within the display region a, the projection of the first insulating layer 4 covers the projection of the conductive layer 5 in plan view of the array substrate. Optionally, each first insulating unit covers each conductive unit within the display region a. As a result, the conductive layer 5 does not occupy any additional aperture region of the array substrate. By having the conductive layer 5 covered by the first insulating layer 4, the aperture ratio of the array substrate is not substantially affected.

In some embodiments, the first electrode 8 is connected to the conductive layer 5 outside the display region a. As a result, the IR drop of the first electrode 8 can be significantly reduced, resulting in a more uniform image display. In some embodiments, the first electrode 8 is connected to the conductive layer 5 within the display region a.

In some embodiments, prior to forming the first insulating layer 4, the method further includes forming a thin film transistor 2 on a base substrate 1, followed by forming a second electrode 3 on the base substrate 1 having the thin film transistor 2. In some embodiments, prior to forming the first electrode 8 and after forming a second insulating layer 6, the method further includes forming an organic light emitting layer 7. As shown in FIGS. 2 and 3, an array substrate so manufactured includes the base substrate 1, the thin film transistor 2, the second electrode 3, and the organic light emitting layer 7. Optionally, the thin film transistor 2, the second electrode 3, the first insulating layer 4, the conductive layers 5, the second insulating layer 6, the organic light emitting layer 7, and the first electrode 8 are sequentially disposed on the base substrate 1. In some embodiments, the conductive layer 5 is insulated from the organic light emitting layer 7, e.g., by the second insulating layer 6.

As discussed above, the conductive layer 5 may be connected to the first electrode 8 in the display region a of the array substrate or may be connected to the first electrode 8 outside of the display region a. When the array substrate is connected to the first electrode 8 outside the display region a of the array substrate, optionally the first electrode 8 is connected to the conductive layer 5 through a via 61 in the second insulating layer 6 (FIG. 3). Optionally, the conductive layer 5 has a portion 51 not covered by the second insulating layer 6 outside the display region a. Optionally, the conductive layer 5 is connected to the first electrode 8 through the portion 51 (FIG. 2).

When the second insulating layer 6 covers the conductive layer 5 outside the display region a, the method in some embodiments further includes, forming a via 61 in the second insulating layer 6 for connecting the conductive layer 5 to the first electrode 8 outside the display region a. Optionally, after forming the second insulating layer 6, the step of forming the organic light emitting layer 7 includes masking the via 61 using a mask, and evaporation coating the base substrate 1 with an organic light emitting material. By using a mask masking the via 61 during the evaporation coating of the organic light emitting material, clogging of the via 61 by the organic light emitting material may be avoided.

Figure 4:
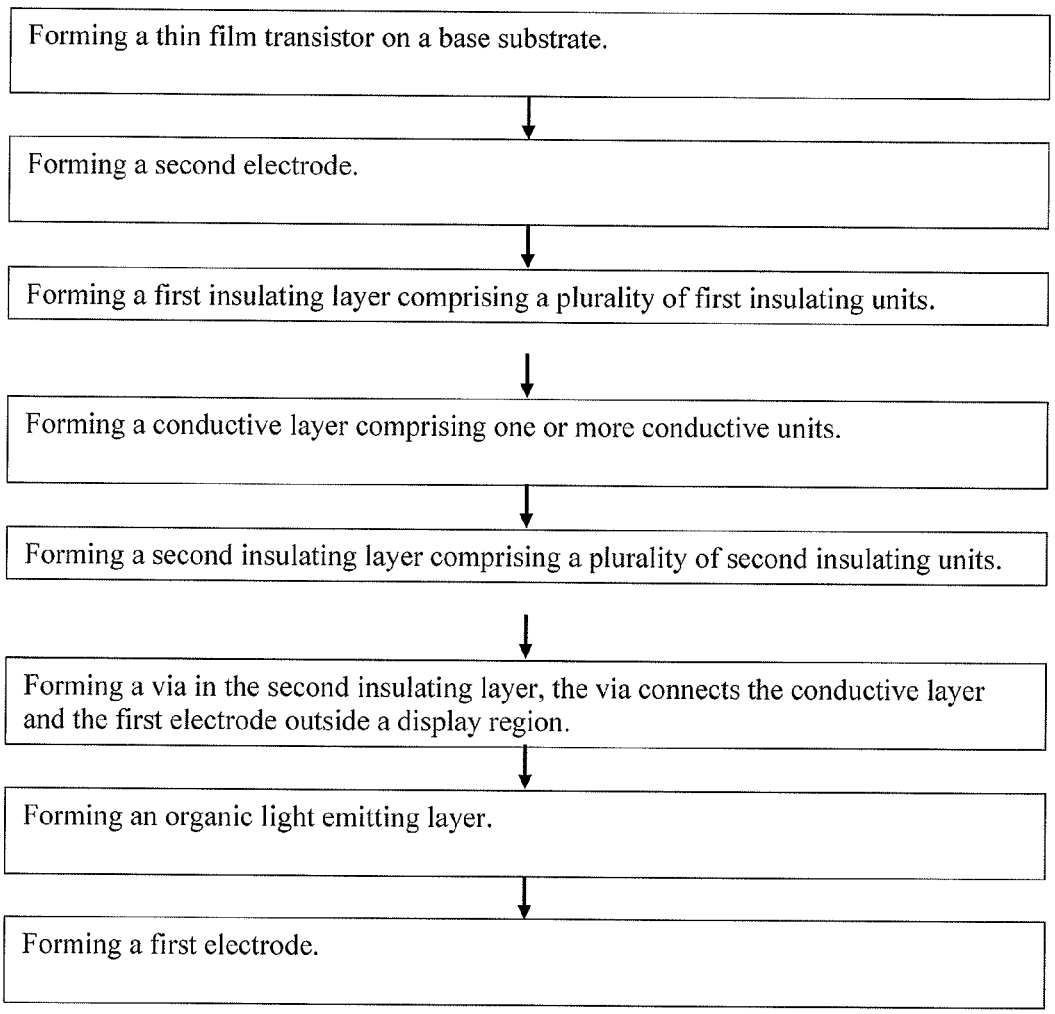
FIG. 4 a flow chart illustrating a method of manufacturing an OLED array substrate in an embodiment.

FIG. 4 a flow chart illustrating a method of manufacturing an OLED array substrate in an exemplary embodiment. Referring to FIG. 4, the method in the embodiment includes forming a thin film transistor 2 on a base substrate 1, forming a second electrode 3, forming a first insulating layer 4 having a plurality of first insulating units, forming a conductive layer 5 having one or more conductive units, forming a second insulating layer 6 having a plurality of second insulating units, forming a via 61 in the second insulating layer 6, the via 61 connects the conductive layer 5 and the first electrode 8 outside the display region a, forming an organic light emitting layer?, and forming a first electrode 8.

The thin film transistor includes a gate electrode, an active layer, a source electrode, and a drain electrode.

Optionally, the second electrode 3 is a multi-layer electrode comprising indium tin oxide and silver. Optionally, the second electrode 3 is a multi-layer high-reflective electrode having indium tin oxide and silver for enhanced light utilization.

In some embodiments, the first insulating layer 4 is made of a first insulating material comprising an inorganic insulating material such as silicon nitride ($SIN_x$), silicon oxide ($SiO_x$), or silicon oxide nitride ($SiO_xN_y$). Optionally, the first insulating material is deposited by vacuum vapor deposition on the base substrate 1 having the second electrode 3 disposed. A photoresist is then formed on the deposited first insulating material and a mask having a predetermined first insulating layer pattern is placed on the photoresist layer, followed by UV exposure, development, baking and etching, thereby forming the first insulating layer 4. Optionally, the etching is done by a dry etching method.

In some embodiments, the first insulating material is a photoresist layer. Optionally, the photoresist material is coated on the base substrate 1 having the second electrode 3 disposed. A mask having a predetermined first insulating layer pattern is placed on the photoresist layer, followed by UV exposure and development, thereby forming the first insulating layer 4. Optionally, other appropriate organic materials can be used for making the insulating layer, including, but are not limited to an acrylic resin, a polyimide resin, etc.

To avoid any connection between the conductive layer 5 and the second electrode 3, the conductive layer 5 is covered by the first insulating layer 4 within the display region a. For example, the projection of the first insulating layer 4 covers the projection of the conductive layer 5 within the display region a in plan view of the array substrate. Optionally, the conductive layer 5 is made of one or more of indium tin oxide, molybdenum, aluminum, and neodymium.

To avoid any connection between the conductive layer 5 and the organic light emitting layer 7, the conductive layer 5 is covered by the second insulating layer 6 within the display region a.

In some embodiments, the second insulating layer 6 is made of a second insulating material having an inorganic insulating material such as silicon nitride ($SiN_x$), silicon oxide ($SiO_x$), or silicon oxide nitride ($SiO_xN_y$). Optionally, the second insulating material is deposited by vacuum vapor deposition on the base substrate 1 having the conductive layer 5 disposed. A photoresist is then formed on the deposited second insulating material and a mask having a predetermined second insulating layer pattern is placed on the photoresist layer, followed by UV exposure, development, baking and etching, thereby forming the second insulating layer 6. Optionally, the etching is done by a dry etching method.

In some embodiments, the second insulating material is a photoresist layer. Optionally, the photoresist material is coated on the base substrate 1 having the conductive layer 5 disposed. A mask having a second insulating layer pattern is placed on the photoresist layer, followed by UV exposure and development, thereby forming the second insulating layer 6. Optionally, other appropriate organic materials can be used for making the insulating layer, including, but are not limited to an acrylic resin, a polyimide resin, etc.

In some embodiments, a photoresist material is coated on the base substrate 1 having the second insulating layer 6 formed. A mask having a via 61 pattern is placed on the photoresist layer, followed by UV exposure, development, baking and etching, thereby forming the via 61 for connecting the conductive layer 5 and the first electrode 8. Optionally, the via 61 is disposed outside the display region a of the array substrate.

In some embodiments, an organic light emitting material is evaporation coated on the base substrate 1 having the via 61 formed on the second insulating layer 6, thereby forming the organic light emitting layer 7. Optionally, after forming the second insulating layer 6, the step of forming the organic light emitting layer 7 includes masking the via using a mask, and evaporation coating the base substrate 1 with an organic light emitting material.

In some embodiments, the first electrode is made of magnesium or silver.

The present disclosure further provides an organic light emitting diode display device having an organic light emitting diode array substrate described herein or manufactured by a method described herein.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An organic light emitting diode array substrate, comprising:
   a base substrate;
   a first electrode;
   a second electrode; and
   a pixel definition layer comprising:
      a first insulating layer comprising a plurality of first insulating units;
      a second insulating layer comprising a plurality of second insulating units; and
      a conductive layer comprising a plurality of interconnected conductive units sandwiched by the first insulating layer and the second insulating layer;
   wherein each of the plurality of interconnected conductive units is sandwiched by one of the plurality of first insulating units and one of the plurality of second insulating units;
   a projection of at least one of the plurality of interconnected conductive units on the base substrate is covered by those of one of the plurality of first insulating units and one of the plurality of second insulating units;
   the first insulating layer and the second insulating layer are between the first electrode layer and the second electrode layer.

2. The organic light emitting diode array substrate of claim 1, wherein the conductive layer is covered by the first insulating layer and the second insulating layer in a non-peripheral region of the organic light emitting diode array substrate.

3. The organic light emitting diode array substrate of claim 1, wherein the conductive layer is connected to the first electrode in a peripheral region of the organic light emitting diode array substrate.

4. The organic light emitting diode array substrate of claim 1, wherein the conductive layer is insulated from the second electrode by the first insulating layer.

5. The organic light emitting diode array substrate of claim 1, wherein the second electrode, the first insulating layer, the conductive layer, the second insulating layer, and the first electrode are sequentially on the base substrate.

6. The organic light emitting diode array substrate of claim 1, further comprising:
   a thin film transistor; and
   an organic light emitting layer.

7. The organic light emitting diode array substrate of claim 6, wherein the thin film transistor, the second electrode, the first insulating layer, the conductive layer, the second insulating layer, the organic light emitting layer, and the first electrode are sequentially on the base substrate.

8. The organic light emitting diode array substrate of claim 6, wherein the conductive layer is insulated from the organic light emitting layer by the second insulating layer.

9. The organic light emitting diode array substrate of claim 3, wherein the conductive layer comprises, in the peripheral region of the organic light emitting diode array substrate, a portion not covered by the second insulating layer, the portion is connected to the first electrode.

10. The organic light emitting diode array substrate of claim 3, wherein the second insulating layer covers the conductive layer in the peripheral region of the organic light emitting diode array substrate, the first electrode is connected to the conductive layer through a via in the second insulating layer in the peripheral region of the organic light emitting diode array substrate.

11. The organic light emitting diode array substrate of claim 1, wherein the second insulating layer is made of a second insulating material comprising an inorganic insulating material; and the conductive layer is made of a conductive material comprising one or more of indium tin oxide, molybdenum, aluminum, and neodymium.

12. An organic light emitting diode display device, comprising an organic light emitting diode array substrate of claim 1.

13. A method of manufacturing an organic light emitting diode array substrate, comprising:
   forming a second electrode on a base substrate;
   forming a pixel definition layer comprising:
      forming a first insulating layer comprising a plurality of first insulating units;
      forming a second insulating layer comprising a plurality of second insulating units; and
      forming a conductive layer comprising a plurality of interconnected conductive units sandwiched by the first insulating layer and the second insulating layer;
   forming a first electrode; and
   connecting the conductive layer to the first electrode;
   wherein each of the plurality of interconnected conductive units is formed to be sandwiched by one of the plurality of first insulating units and one of the plurality of second insulating units;
   a projection of at least one of the plurality of interconnected conductive units on the base substrate is covered by those of one of the plurality of first insulating units and one of the plurality of second insulating units; and
   the first insulating layer and the second insulating layer are formed to be between the first electrode layer and the second electrode layer.

14. The method of claim 13, wherein the conductive layer is formed to be covered by the first insulating layer and the second insulating layer in a non-peripheral region of the organic light emitting diode array substrate.

15. The method of claim 13, wherein the conductive layer is insulated from the second electrode by the first insulating layer.

16. The method of claim 13, wherein the second electrode, the first insulating layer, the conductive layer, the second insulating layer, and the first electrode are sequentially on the base substrate.

17. The method of claim 13, further comprising:
    forming a thin film transistor on the base substrate prior to forming the first insulating layer; and
    forming an organic light emitting layer prior to forming the first electrode and after forming a second insulating layer.

18. The method of claim 17, wherein the conductive layer is insulated from the organic light emitting layer by the second insulating layer.

19. The method of claim 13, wherein the second insulating layer covers the conductive layer in a peripheral region of the organic light emitting diode array substrate; and
    the method further comprising:
    forming a via in the second insulating layer in the peripheral region of the organic light emitting diode array substrate, the first electrode is connected to the conductive layer through the via.

20. The method of claim 19, wherein, after forming the second insulating layer, the step of forming the organic light emitting layer comprises:
    masking the via using a mask; and
    evaporation coating the base substrate with an organic light emitting material.

* * * * *